(12) United States Patent
Tiner et al.

(10) Patent No.: US 9,223,295 B2
(45) Date of Patent: Dec. 29, 2015

(54) TIME-TO-DIGITAL CONVERTER

(71) Applicant: International Business Machines Corporation, Armonk, NY (US)

(72) Inventors: Marshall D Tiner, Elgin, TX (US); Xiaobin Yuan, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/255,988

(22) Filed: Apr. 18, 2014

(65) Prior Publication Data

US 2015/0301505 A1 Oct. 22, 2015

(51) Int. Cl.
*H03M 1/50* (2006.01)
*G04F 10/00* (2006.01)
*H03M 1/60* (2006.01)

(52) U.S. Cl.
CPC ............ *G04F 10/005* (2013.01); *H03M 1/50* (2013.01); *H03M 1/60* (2013.01)

(58) Field of Classification Search
CPC .......... H03M 1/50; H03M 1/60; G04F 10/005
USPC .......................... 341/155, 157, 166
See application file for complete search history.

(56) References Cited

U.S. PATENT DOCUMENTS

| | | | | |
|---|---|---|---|---|
| 5,875,219 | A * | 2/1999 | Kim | 375/376 |
| 6,417,706 | B2 * | 7/2002 | Kondo | 327/158 |
| 7,427,940 | B2 * | 9/2008 | Staszewski et al. | 341/155 |
| 7,501,973 | B2 | 3/2009 | Choi et al. | |
| 7,564,284 | B2 | 7/2009 | Henzler et al. | |
| 7,629,915 | B2 | 12/2009 | Lin | |
| 7,667,633 | B2 | 2/2010 | Choi et al. | |
| 7,928,888 | B1 | 4/2011 | Chiu et al. | |
| 8,098,085 | B2 | 1/2012 | Wang et al. | |
| 8,174,293 | B2 * | 5/2012 | Yoshihara et al. | 327/107 |
| 8,325,076 | B2 | 12/2012 | Yousif et al. | |
| 8,446,302 | B2 | 5/2013 | Miyashita | |
| 2013/0214959 | A1 * | 8/2013 | Lee | 341/166 |

FOREIGN PATENT DOCUMENTS

WO WO 2013/040058 3/2013

OTHER PUBLICATIONS

Henzler et al Variation Tolerant High Resolution and Low Latency Time-to-Digital Converter, solid State Circuits Conference, 2007, ESSCIRC2007, 33rd European.

(Continued)

*Primary Examiner* — Khai M Nguyen
(74) *Attorney, Agent, or Firm* — Margaret A. McNamara

(57) ABSTRACT

A time-to-digital converter (TDC) in which a chain of inverters with finite propagation delays form a delay line in which a level transition applied to one end of the delay line from an input line produces a series of progressively delayed level transitions of alternating polarity along the delay line. Each inverter has an associated pass gate, with the output of the inverter together with the output of the preceding delay line element driving the complementary gate inputs of the pass gate. The complementary gate inputs of each pass gate are coupled to the corresponding delay line outputs in an alternating manner so that, as the level transitions traverse the delay line, the pass gates are progressively enabled to couple the input line to corresponding output lines to produce a series of progressively delayed level transitions of like polarity on those output lines.

18 Claims, 3 Drawing Sheets

(56) References Cited

OTHER PUBLICATIONS

Henzler et al A Local Passive Time Interpolation Concept for Variation-Tolerant High-Resolution Time-to-Digital Conversion, IEEE Journal of Solid State Circuits, vol. 43, No. 7, Jul. 2008.

Robert Staszewski et al., "1.3 V 20 ps. Time-to-Digital Converter for Frequency Synthesis in 90-nm CMOS", IEEE Transactions on Circuits and Systems-II: Express Briefs, vol. 53, No. 3, Mar. 2006, pp. 220-224.

R Franch et al. "On-Chip Timing Uncertainly Measurements on IBM Microprocessors", Test Conference, 2008,. ITC 2008 IEEE International, Oct. 2008, pp. 1-7.

Bruno W Garlepp et al. "A Portable Digital DLL for High-Speed CMOS Interface Circuits", IEEE Journal of SolidState Circuits, vol. 34, No. 5, May 1998, pp. 632-644.

S Henzler, "Chapter 2—Time-to-Digital Converter Basics" Time-to-Digital Converters, Springer Series in Advanced Microelectronics 29, 2010.

* cited by examiner

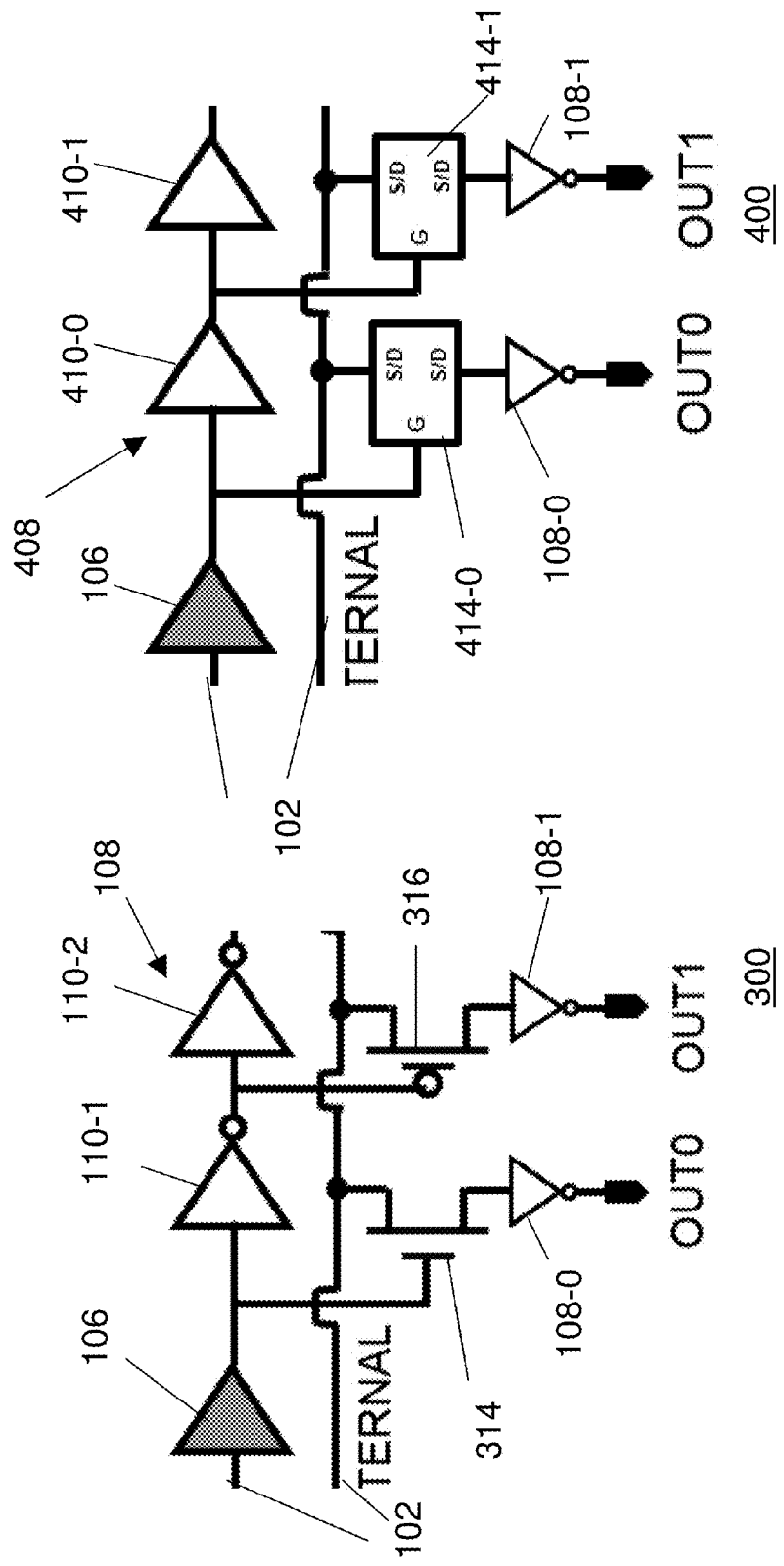

TIME-TO-DIGITAL CONVERTER

BACKGROUND

Time-to-digital converters (TDCs) are devices that are used to convert a time interval or delay following a level transition to a digital signal encoding the time delay. One type of TDC known to the art is constructed out of a tapped delay line in which digital devices (typically either inverters or non-inverting buffers) functioning as delay elements are connected in series. Because of the propagation delay inherent in such devices as a level transition makes its way down the chain, the outputs from such devices can be used to generate a parallel signal that encodes the elapsed time since an initial level transition. However, while existing delay line TDCs are generally operable to convert a time delay to a parallel digital signal, they are not without their drawbacks as they relate to such factors as linearity, latency, resolution, gate count and the like.

SUMMARY

One embodiment of the present invention contemplates apparatus comprising a plurality of serially connected delay line elements forming a delay line having one end connected to an input line, wherein a level transition applied to the one end of the delay line from the input line produces a series of progressively delayed level transitions at points along the delay line, and a plurality of gates coupling the input line to respective output lines, wherein each gate has a gate input coupled to a different point along the delay line so that the level transitions along the delay line progressively enable the gates produce a series of progressively delayed level transitions on the output lines.

In an embodiment, the progressively delayed level transitions on the output lines may encode a time interval elapsing after the level transition on the input line. In another embodiment, a level transition in a first direction on the input line produces a series of progressively delayed level transitions on the output lines, while a level transition in a second direction on the input line produces substantially concurrent level transitions on the output lines.

A buffer may couple a first delay line element in the delay line to the input line, while respective inverters couple the gates to the output lines.

In one embodiment, the delay line elements may comprise non-inverting buffers and the gates may all be enabled by gate inputs at a common logic level. In an alternative embodiment, the delay line elements may comprise inverters and the gates may comprise a first plurality of gates enabled by gate inputs at a first logic level alternating with a second plurality of gates enabled by gate inputs at a second logic level. In yet another alternative embodiment, the delay line elements may comprise inverters and each of the gates may comprise a pass gate having a first gate input that is coupled to one point along the delay line and enabled at a first logic level and a second gate input that is coupled to an immediately following point along the delay line and enabled at a second logic level. In the latter embodiment, the first and second gate inputs of successive pass gates may be enabled at alternating logic levels so that level transitions of alternating polarity along the delay line progressively enable pass gates along the delay line to couple the input line to the corresponding output lines.

Yet another embodiment of the invention contemplates a method comprising applying a level transition from an input line to one end of a delay line comprising a plurality of serially connected delay line elements to produce a series of progressively delayed level transitions at points along the delay line and coupling the input line via a plurality of gates to respective output lines, wherein each gate has a gate input coupled to a different point along the delay line so that the level transitions along the delay line progressively enable the gates produce a series of progressively delayed level transitions on the output lines. Possible variants of this method embodiment are similar to those described above for the apparatus embodiment.

BRIEF DESCRIPTION OF THE SEVERAL VIEWS OF THE DRAWINGS

FIG. 3 is a schematic diagram of an alternative embodiment in which the pass gates are replaced by field-effect transistors (FETs).

FIG. 4 is a schematic diagram of an alternative embodiment in which the delay line inverters are replaced by non-inverting buffers.

DETAILED DESCRIPTION

Figure 1:
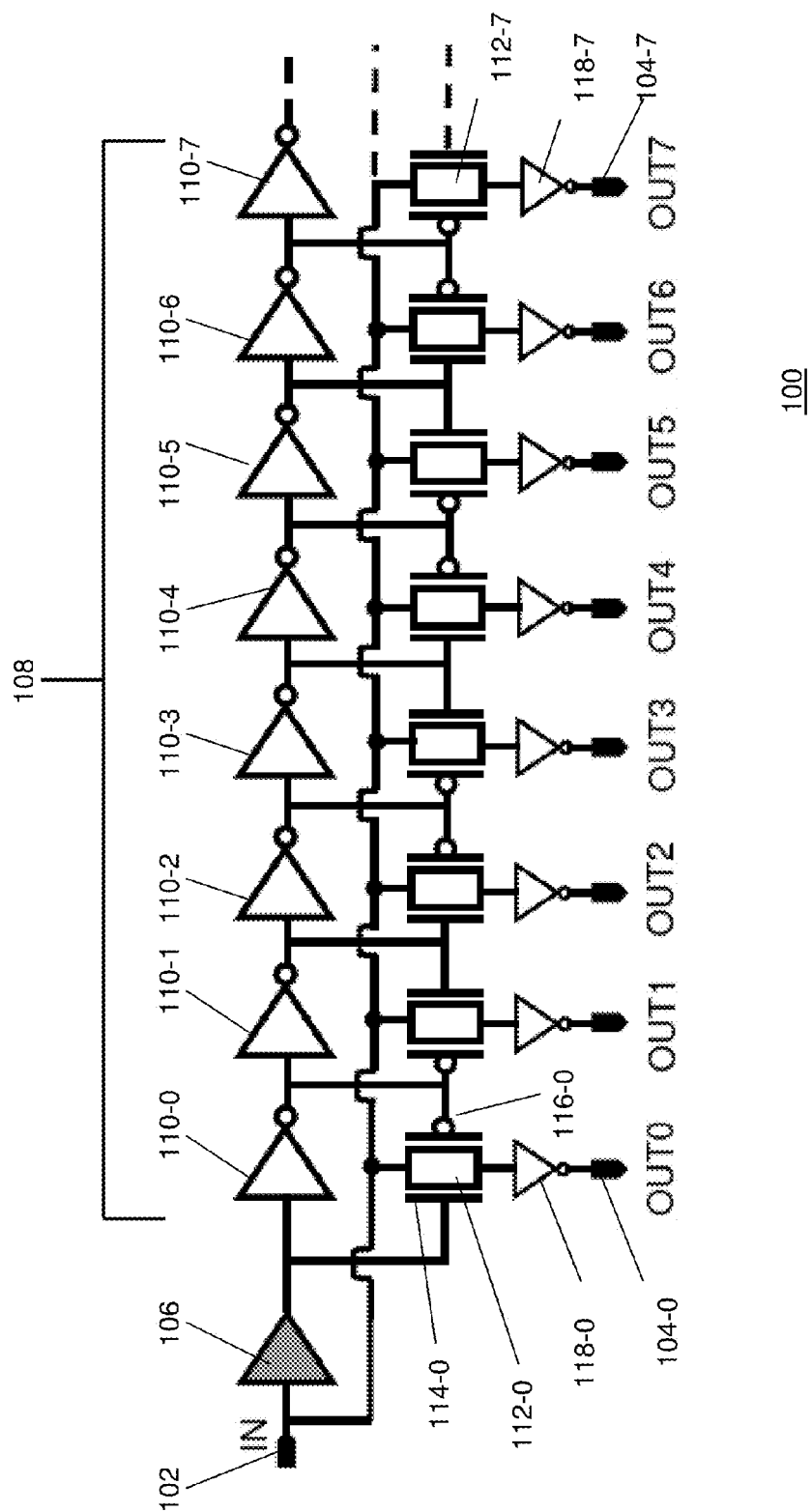
FIG. 1 is a schematic diagram of a time-to-digital converter (TDC) according to one embodiment of the invention.

FIG. 1 is a schematic diagram of a time-to-digital converter (TDC) 100 according to one embodiment of the invention. TDC 100 has a single input line 102 (IN) for receiving an input signal and a plurality of output lines 104 (OUT0-OUT7) for providing progressively delayed versions of the signal on input line 102. Although 8 output lines are depicted in the embodiment shown, the particular number of output lines is not critical, and a different number of output lines could be used instead. Further, while an integrated circuit (IC) is a preferred implementation, this is not required, and discrete elements can be used if desired.

A buffer 106 having its input coupled to input line 102 drives one end of an delay line 108 comprising a serially connected chain of inverters 110 equal in number to the output lines 104. More particularly, the first inverter 110 in the delay line 108 is coupled to the output of buffer 106, while each inverter 110 after the first has its input coupled to the output of the preceding inverter in the delay line. It will be apparent from the structure described that a level transition at the beginning of the delay line 108 will produce a corresponding set of level transitions of alternating polarity (i.e., alternating between high-to-low and low-to-high) along the delay line, with each succeeding transition along the delay line being delayed in time and inverted relative to the previous level transition in the delay line. While inverters 110 will typically have identical characteristics, i.e., the same size or FET width, this is not required, and their sizes could be adjusted as necessary to get a more linear progression of the delay steps described below. Preferably, to optimize performance, all of the elements in circuit 100 receive a supply voltage that is well regulated and prevented from becoming unduly low.

Each inverter 110 has its input and output coupled to respective gating inputs of a pass gate 112 gating the input line 102 to a respective one of output lines 104 (OUT0-OUT7) through an inverter 118. As with the inverters 110, while inverters 118 will typically be identical to one another, their sizes could be adjusted as necessary to get a more linear progression of the delay steps described below. As is conventional in the art, each pass gate 112 is formed by an n-type field-effect transistor (nFET) 114 and a p-type field-effect transistor (pFET) 116, the sources and drains of which are connected together to form the source and drain, respectively, of the pass gate 112. One of the gating inputs in this arrangement is the pFET gate (or p-gate), while the other gating input is the nFET gate (or n-gate). As is known in the art, each pass gate 112 provides a low-impedance path between its source and drain when the n-gate is high (or 1) and the p-gate is low (or 0), turning the pass gate "on", and provides a high-impedance path between its source and drain when the n-gate is low and the p-gate is high, turning the pass gate "off". Stated somewhat differently, each pass gate 112 has a first gate input that is coupled to one point along the delay line 108 and enabled at a first logic level and a second gate input that is coupled to an immediately following point along the delay line and enabled at a second logic level.

Pass gates 112 are arranged so that for the even-numbered pass gates in the series (pass gates 112-0, 112-2, 112-4, 112-6) the pFET gate is coupled to the input while the nFET gate is coupled to the output of the corresponding inverter 104, while for the odd-numbered pass gates in the series (pass gates 112-1, 112-3, 112-5, 112-7) the pFET gate is coupled to the output while the nFET gate is coupled to the input of the corresponding inverter 104, so that the first and second gate inputs of successive pass gates 112 are enabled at alternating logic levels. By virtue of this arrangement, as described more fully below, the level transitions of alternating polarity along the delay line 108 progressively enable the pass gates 112 along the delay line to couple the input line 102 to the corresponding output lines 104.

Figure 2:
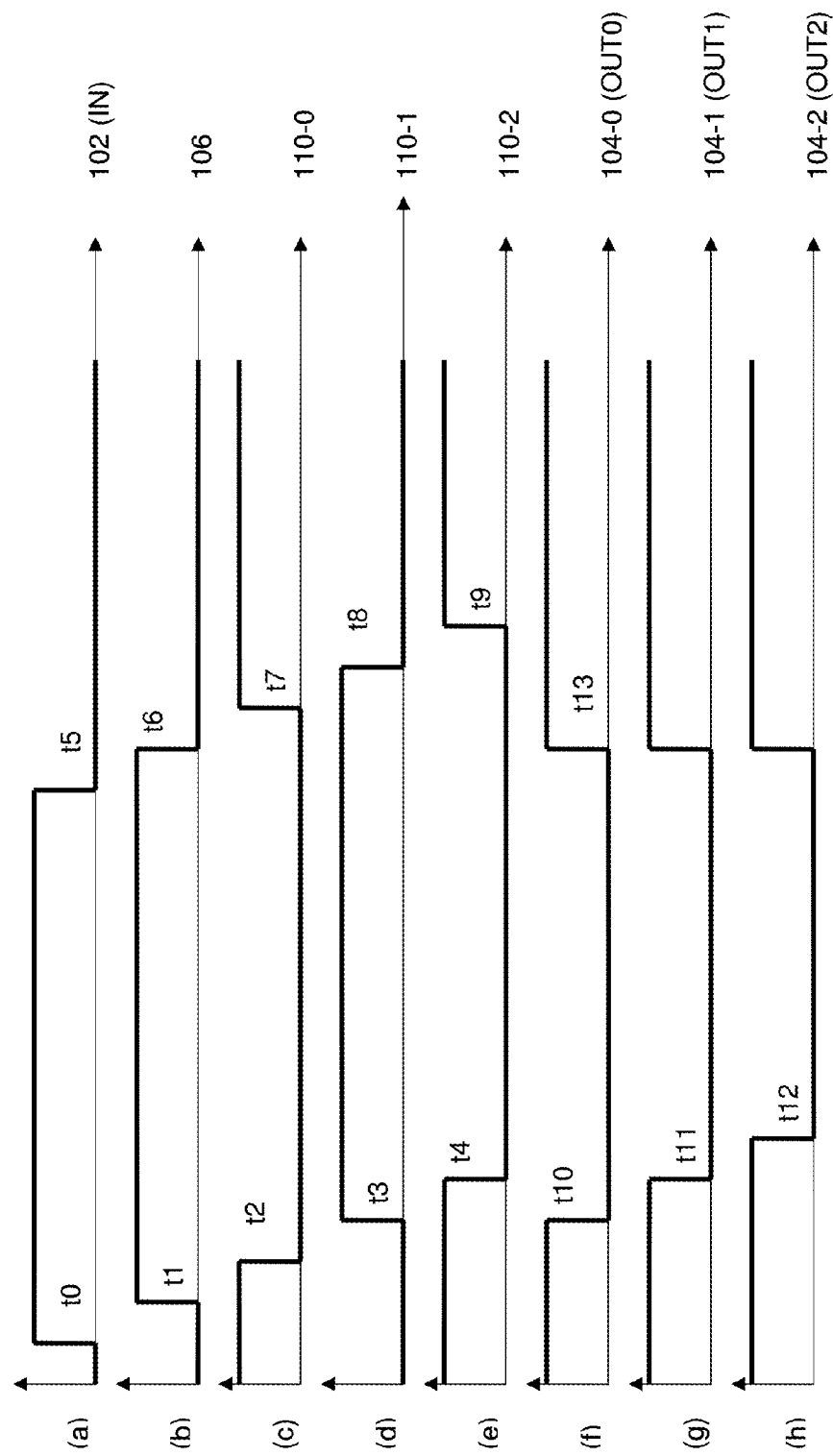
FIG. 2 shows the logic levels on various lines of the TDC shown in FIG. 1 at various instants in an operational cycle.

FIG. 2 shows the logic levels on various lines of interest for the first three stages of the delay line 108 at various instants in an operational cycle for the input signal shown in plot (a). Initially, input line 102 and buffer 106 are at a low logic level, as are the odd-numbered inverters 110-1, 110-3, 110-5 and 110-7, while the even-numbered inverters 110-0, 110-2, 110-4 and 110-6 are at a high logic level. At time t0 in this example, input line 102 (IN) undergoes a positive-going level transition. At t1, following a buffer propagation delay, this first transition produces a similar positive-going level transition at the output of buffer 106, as shown in plot (b). Thereafter, at time t2, following an inverter propagation delay, the positive-going transition at the output of buffer 106 produces a negative-going transition at the output of inverter 110-0, the first inverter in the delay line 108, as shown in plot (c).

Similarly, at time t3, following another inverter propagation delay, the negative-going transition at the output of inverter 110-0 produces a positive-going transition at the output of inverter 110-1, the second inverter in the delay line 108, as shown in plot (d). Likewise, at time t4, following another inverter propagation delay, the positive-going transition at the output of inverter 110-1 produces a negative-going transition at the output of inverter 110-2, the third inverter in the delay line 108, as shown in plot (e). Although not shown in FIG. 2, this process continues down the delay line 108, with each level transition being in an opposite direction and delayed relative to the transition in the previous element in the delay line.

Referring to the same plots (a)-(e), when the input line 102 (IN) eventually transitions back to a low logic level, at time t5, this produces a corresponding series of progressively delayed level transitions at the output of buffer 106, at time t6, and at the outputs of inverters 110-0, 110-1 and 110-2 at times t7, t8 and t9, respectively. As with the level transitions at times t0‑44, this process continues down the delay line 108, with each level transition being in an opposite direction and delayed relative to the transition in the previous element in the delay line. Upon the completion of these level transitions, all of these outputs are at their original logic levels shown at the left in FIG. 2.

These level transitions at the outputs of buffer 106 and inverters 110-0 to 110-7 produce a corresponding series of level transitions on output lines 104-0 to 104-7 (OUT1‑OUT7). Initially, as noted above, the buffer 106 and odd-numbered inverters 110 driving the n-gates of pass gates 112 are at a low logic level, while the even-numbered inverters 110 driving the p-gates of pass gates 112 are at a high logic level. As a result, pass gates 112 are all turned "off" to create a high-impedance connection between the input line 102 and output inverters 118. Under these conditions (as a result of a previous cycle, as described below), inverters 118 produce "high" logic levels on output lines 104, as shown for output lines 104-0 to 104-2 in plots (f)-(h).

Referring to plot (f), following the level transitions occurring at times t1 and t2 at the input and output to inverter 110-0, pass gate 112-0 is turned "on" to couple the high logic level on input line 102 to the input of inverter 118-0. (Due to the propagation delay through inverter 110-0, the n-gate input to pass gate 112-0 goes positive before the p-gate input goes negative, so that pass gate 112-0 is partially turned on during this time interval. This is not important to the overall operation of TDC 100, but is noted for completeness.) This in turn causes inverter 118-0 to produce a low logic level on output line 104-0 (OUT0), at time t10. In a similar manner, referring to plot (g), following the level transitions occurring at times t2 and t3 at the input and output to inverter 110-1, pass gate 112-1 is turned "on" to couple the high logic level on input line 102 to the input of inverter 118-1. This in turn causes inverter 118-1 to produce a low logic level on output line 104-1 (OUT1), at time tn.

Likewise, referring to plot (h), following the level transitions occurring at times t3 and t4 at the input and output to inverter 110-2, pass gate 112-2 is turned "on" to couple the high logic level on input line 102 to the input of inverter 118-2. This in turn causes inverter 118-2 to produce a low logic level on output line 104-2 (OUT2), at time t12. Although not shown in FIG. 2, this process continues down the array of output inverters 118 just as it did with the delay line inverters 110, so that each output inverter 118 produces a negative-going output that is slightly delayed relative to the previous inverter in the array.

When the input line 102 again transitions back to a low logic level at time t5, the input to pass gates 112 from line 102 immediately goes negative. Since at this time pass gates 112 are all still "on", this input is propagated to the input of inverters 118 to produce high logic levels at the outputs of the inverters 118 at a time t13. Inverters 118 continue to produce high logic levels on lines 104 in preparation for another cycle when the pass gates 112 eventually switch off (in a progressive manner following the negative-going level transition on line 102 at t5), since the inverters in effect store the (low) logic levels at their inputs at the time of pass gate switch-off.

Output lines 104 produce the familiar "thermometer" code indicating, by the number of lines that have transitioned to zero, the relative time that has elapsed since the positive-going transition on line 102 (IN) at t0. The progressively delayed level transitions on the output lines 104 (at times t10-t12 for the first three output lines) thus encode the time interval elapsing after the level transition on the input line 102 at time t0. This is indicated in the table below for the first three output lines 104-0 to 104-2 (OUT0-OUT2):

| Interval | OUT0 | OUT1 | OUT2 |
| --- | --- | --- | --- |
| t < t10 | 1 | 1 | 1 |
| t10 < t < t11 | 0 | 1 | 1 |
| t11 < t < t12 | 0 | 0 | 1 |
| t > t12 | 0 | 0 | 0 |

Because the elements in the delay line 108 are inverters, the granularity achieved is about twice that (i.e., half the time interval) of a delay line composed of non-inverting buffers, which have twice the gate count. Because the pass gates 112 are configured with gates of like polarity coupled together to a common line, in an alternating fashion as shown in FIG. 1, output signals OUT0-OUT7 conform to a standard thermometer code rather than the "pseudo" thermometer code of standard inverter delay lines.

While the embodiment shown in FIG. 1, in which the gates are pass gates, represents a preferred embodiment, other embodiments are possible. Thus, referring to FIG. 3, in one alternative embodiment 300, the pass gates 112 are replaced by gates comprising an alternating series of nFETs 314 enabled by gate inputs at a high logic level and pFETs 316 enabled by gate inputs at a low logic level, with the nFETs 314 being coupled to the inputs of the even-numbered inverters 110 in the delay line 108 and the pFETs being coupled to the odd-numbered inverters 110 in the delay line 108. It will be seen that the alternative embodiment 300 is basically the embodiment 100 with the halves of the pass gates 112 on the right or downstream side of FIG. 1 removed. Alternatively, although not shown, the embodiment of FIG. 1 could be modified by removing the pass gate halves on the left or upstream side instead, so that a pFET would be driven by inverter 110-0, an nFET would be driven by inverter 110-1, and so on, in alternating fashion down the delay line 108.

In yet another alternative embodiment 400, shown in FIG. 4, the inverter delay line 108 of FIG. 3 is replaced by a delay line 408 made up of non-inverting buffers 410. Since the edge transitions along the delay line 408 are all of the same type for a given edge transition on line 102, the alternating series of nFETs 314 and pFETs 316 is replaced by a single series of gates 414 that are either all nFETs or all pFETs that are enabled by gate inputs at a common logic level. If nFETs are used for gates 414, the operation is generally similar to that of the embodiments shown in FIGS. 1 and 3, with the timing shown in FIG. 2. If, on the other hand, pFETs are used for the gates 414, than the successive edge delays on output lines OUT0-OUT7 are generated on the falling edge of the input signal on line 102 rather than on the rising edge as shown in FIG. 2.

While the circuits 100, 300 and 400 described above will find their prime use as time-to-digital converters, they also have other uses. In particular, since the falling-edge level transitions of output signals OUT0-OUT7 are progressively delayed whereas the rising-edge level transitions are substantially concurrent with one another, these circuits can be used to effectively chop the input signal IN to create output signals OUT0-OUT7 whose duty cycles vary in fine steps. In a preferred embodiment, the output signals OUT0-OUT7 may change the duty cycle of the input signal IN by approximately 1.5% to 2% each step. Thus, these circuits can be used to adjust signal duty cycles in digital systems in addition to being used as TDCs.

Technical effects and benefits include providing a time-to-digital converter with an advantageous combination of resolution, tolerance, linearity, latency and gate count, and which can also be used to adjust the duty cycle of an input clock signal. While some technical effects and benefits are described, embodiments of the invention are not limited by the described technical effects and benefits, and some embodiments of the invention may include different technical effects and benefits.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. Apparatus comprising:
   a plurality of serially connected delay line elements forming a delay line having one end connected to an input line, wherein a level transition applied to the one end of the delay line from the input line produces a series of progressively delayed level transitions at points along the delay line; and
   a plurality of gates coupling the input line to respective output lines, wherein each gate has a gate input coupled to a different point along the delay line so that the level transitions along the delay line progressively enable the gates produce a series of progressively delayed level transitions on the output lines.

2. The apparatus of claim 1, wherein the progressively delayed level transitions on the output lines encode a time interval elapsing after the level transition on the input line.

3. The apparatus of claim 1, wherein a level transition in a first direction on the input line produces a series of progressively delayed level transitions on the output lines, and wherein a level transition in a second direction on the input line produces substantially concurrent level transitions on the output lines.

4. The apparatus of claim 1, further comprising a buffer coupling a first delay line element in the delay line to the input line.

5. The apparatus of claim 1, further comprising respective inverters coupling the gates to the output lines.

6. The apparatus of claim 1, wherein the delay line elements comprise non-inverting buffers and the gates are all enabled by gate inputs at a common logic level.

7. The apparatus of claim 1, wherein the delay line elements comprise inverters and wherein the gates comprise a first plurality of gates enabled by gate inputs at a first logic level alternating with a second plurality of gates enabled by gate inputs at a second logic level.

8. The apparatus of claim 1, wherein the delay line elements comprise inverters and wherein each of the gates comprises a pass gate having a first gate input that is coupled to one point along the delay line and enabled at a first logic level and a second gate input that is coupled to an immediately following point along the delay line and enabled at a second logic level.

9. The apparatus of claim 8, wherein the first and second gate inputs of successive pass gates are enabled at alternating logic levels so that level transitions of alternating polarity along the delay line progressively enable pass gates along the delay line to couple the input line to the corresponding output lines.

10. A method comprising:
applying a level transition from an input line to one end of a delay line comprising a plurality of serially connected delay line elements to produce a series of progressively delayed level transitions at points along the delay line; and
coupling the input line via a plurality of gates to respective output lines, wherein each gate has a gate input coupled to a different point along the delay line so that the level transitions along the delay line progressively enable the gates produce a series of progressively delayed level transitions on the output lines.

11. The method of claim 10, wherein the progressively delayed level transitions on the output lines encode a time interval elapsing after the level transition on the input line.

12. The method of claim 10, wherein a level transition in a first direction on the input line produces a series of progressively delayed level transitions on the output lines, and wherein a level transition in a second direction on the input line produces substantially concurrent level transitions on the output lines.

13. The method of claim 10, wherein a buffer couples a first delay line element in the delay line to the input line.

14. The method of claim 10, wherein respective inverters couple the gates to the output lines.

15. The method of claim 10, wherein the delay line elements comprise non-inverting buffers and the gates are all enabled by gate inputs at a common logic level.

16. The method of claim 10, wherein the delay line elements comprise inverters and wherein the gates comprise a first plurality of gates enabled by gate inputs at a first logic level alternating with a second plurality of gates enabled by gate inputs at a second logic level.

17. The method of claim 10, wherein the delay line elements comprise inverters and wherein each of the gates comprises a pass gate having a first gate input that is coupled to one point along the delay line and enabled at a first logic level and a second gate input that is coupled to an immediately following point along the delay line and enabled at a second logic level.

18. The method of claim 17, wherein the first and second gate inputs of successive pass gates are enabled at alternating logic levels so that level transitions of alternating polarity along the delay line progressively enable pass gates along the delay line to couple the input line to the corresponding output lines.

* * * * *